US006114925A

United States Patent [19]

Lo

[11] Patent Number: 6,114,925

[45] Date of Patent: Sep. 5, 2000

[54] MINIATURIZED MULTILAYER CERAMIC FILTER WITH HIGH IMPEDANCE LINES CONNECTED TO PARALLEL COUPLED LINES

[75] Inventor: Wen-Teng Lo, Shien, Taiwan

[73] Assignee: Industrial Technology Research Institute, Hsinchu, Taiwan

[21] Appl. No.: 09/099,340

[22] Filed: Jun. 18, 1998

[51] Int. Cl.[7] .............................. H03H 7/09; H01P 1/203

[52] U.S. Cl. .............................. 333/185; 333/204

[58] Field of Search .............................. 333/175, 177, 333/185, 204, 205

[56] References Cited

U.S. PATENT DOCUMENTS

| | | | |
|---|---|---|---|
| 5,332,984 | 7/1994 | Abe et al. | 333/219 |
| 5,448,209 | 9/1995 | Hirai et al. | 333/204 |
| 5,523,729 | 6/1996 | Nakai et al. | 333/177 |
| 5,616,528 | 4/1997 | Toda et al. | 333/219.1 |
| 5,777,533 | 7/1998 | Kato et al. | 333/185 |
| 5,917,387 | 6/1999 | Rice et al. | 333/175 X |

FOREIGN PATENT DOCUMENTS

| | | | |
|---|---|---|---|
| 6-77704 | 3/1994 | Japan | 333/204 |
| 6-97705 | 4/1994 | Japan | 333/204 |

*Primary Examiner*—Paul Gensler
*Assistant Examiner*—Barbara Summons
*Attorney, Agent, or Firm*—Birch, Stewart, Kolasch & Birch, LLP

[57] ABSTRACT

A bandpass filter which is suitable to be implemented using a multilayered structure, including multilayer ceramic/low temperature co-fired ceramic (MLC/LTCC) technique, is presented. In structure, there is no need of using a substrate with high dielectric constant to reduce the filter size, and it is suitable to be buried into the substrate and thus easy to integrate with other sub-modules to form a single, miniaturized, multifunction module. Electrically, the proposed filter can be modified by adjusting the location of those poles to meet the system specfication. These drastically reduce the amount or even the need for tuning, thereby lowering the filter cost.

10 Claims, 8 Drawing Sheets

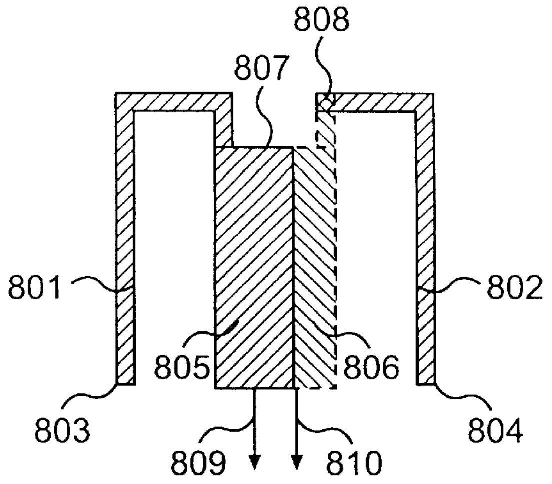
FIG. 8A
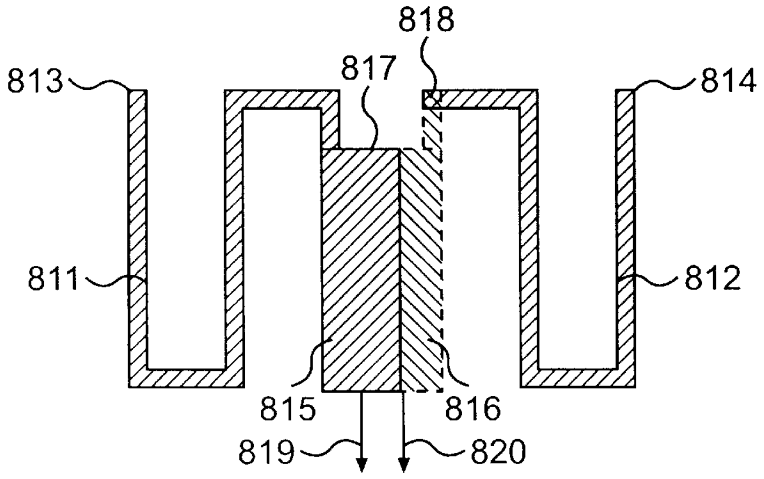
FIG. 8B
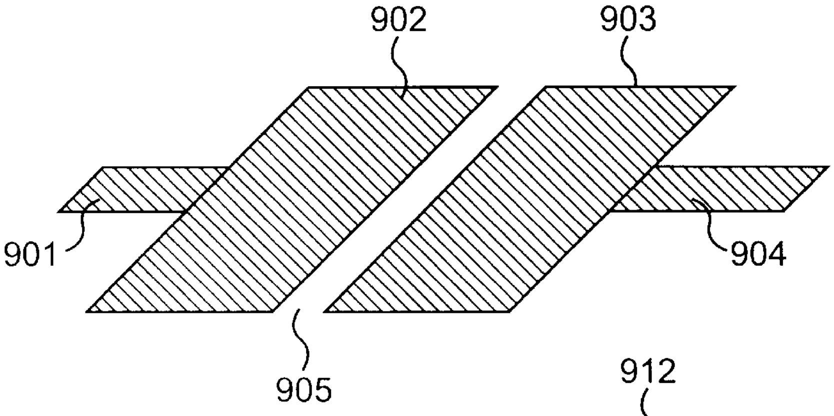
FIG. 9A
FIG. 9B
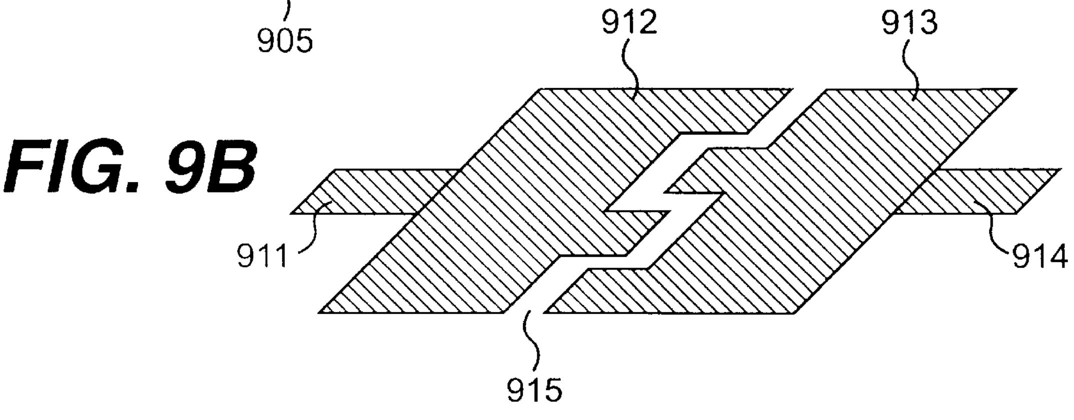

MINIATURIZED MULTILAYER CERAMIC FILTER WITH HIGH IMPEDANCE LINES CONNECTED TO PARALLEL COUPLED LINES

BACKGROUND OF THE INVENTION

1. Technical Field of the Invention

Filters are one of the most commonly used components in communication systems. Filters shape waveforms, match impedance, inhibit harmonic emissions, reduce system and image noise, lower interference, etc. The proposed filter can be extensively used in, for example, wire and wireless communication equipment and handsets for such purposes.

2. Description of Related Art

More than five filters may be used in a modern communication system. Therefore, the performance, size, and cost of filters are very important.

Conventionally, substrates with high dielectric constant are used to reduce filter size. There are two main disadvantages with this conventional solution. First, such filters are difficult to manufacture and process because of the resultant fine line width. Secondly, the performance of the filter is quite sensitive to any layout variations and thus requires extensive post-tuning of multiple components to compensate for such variations. Overcoming the above defects greatly increases the cost of the filter.

In MLC/LTCC (Multilayer Ceramic/Low Temperature Co-fired Ceramic) applications, in order to reduce the size and cost of system module it is desirable that sub-modules be integrated together into a single module. Most passive components, including capacitors, inductors, resistors, filters, transmission lines, DC and interconnect lines, etc., are built into multilayer substrates.

The values of these built-in components must be controlled precisely because they are hard to tune. This also limits the use of substrates with high dielectric constant in these applications. In addition, the structure of filter itself must be suitable to be built into a substrate.

One such conventional multilayer bandpass filter is described in Nakai et al. (U.S. Pat. No. 5,523,729). FIGS. 1A, 1B, and 1C are the equivalent circuits from Nakai et al. and are representative of commercial multilayer bandpass filters. These circuits consist of input and output coupling capacitors, resonant capacitors, resonant and coupling inductors, and a loss-pole shifting capacitor.

The response of the circuit shown in FIG. 1A has one loss pole near the lower side of the passband. FIGS. 1B and 1C result in two loss poles: one loss pole is located at the lower and the other at the higher end of the passband.

Extensive post-tuning is necessary in the circuits shown in FIGS. 1A, 1B and 1C because they all use high dielectric constant materials to reduce the size of filter. This extensive post tuning is indicated by the large number of variable capacitances in the equivalent circuits of FIGS. 1A–C and by the large number of corresponding tuning areas which number as many as ten in Nakai et al.

In addition to the conventional circuit's susceptibility to layout variations and the subsequent need for extensive post tuning, there are two main drawbacks when these conventional circuits are practically applied. First, part of the filter components are exposed to the air which will affect the performance characteristics of the filter by energy coupling with peripheral circuits or components. Secondly, the conventional filter structure cannot be buried into the substrates and is difficult to integrate with other sub-modules to form a single, miniaturized, multifunctional module.

In summary, the main disadvantages of conventional filters are listed as follows.

a. Conventional filters use substrates with high dielectric constant to reduce the filter size which results in an extensive need for post tuning.

b. Part of the conventional filter components are exposed to the air which will affect the filter characteristics because of energy coupling with peripheral circuits or components.

c. The conventional filter structure cannot be buried into the substrate and which makes it difficult to integrate with other sub-modules to form a single, miniaturized, multifunction module.

SUMMARY OF THE INVENTION

In contrast, the inventive filter has the following advantages:

a. There is no need to use a substrate with high dielectric constant to reduce the inventive filter size, which will greatly reduce the amount of or even the need for post tuning.

b. The inventive filter characteristics can be easily modified by adjusting the locations of loss poles to meet the required system specifications. Furthermore, adjusting the capacitance of the loss-pole shifting capacitor has little effect on bandwidth, central frequency, and insertion loss.

c. The inventive filter is easy to design and fabricate for different bandwidth applications.

d. The inventive filter has a construction that is suitable for burying into a substrate and, thus, is easy to integrate with other sub-modules to form a single, miniaturized, multifunction module.

The conventional equivalent circuits shown in FIGS. 1A, 1B, 1C and the inventive equivalent circuits shown in FIGS. 2 and 3 can all be implemented by using multilayer ceramic technology. In construction, the conventional designs must reduce the effects of input and output grounded capacitors by thickening the adjacent substrate layer or cutting part of the top-surface grounded metal.

On the contrary, the present invention takes the input and output grounded capacitors into full consideration. Therefore, the whole filter can be totally built into a substrate and, most importantly, free from the problem of energy coupling with peripheral circuits.

One of advantages of proposed filter is that it shows little effect in bandwidth, central frequency, and insertion loss when adjusting the capacitance of the loss-pole shifting capacitor. Thus, only one element (the loss-pole shifting capacitor) needs to be post tuned, if at all, to achieve the desired filter characteristics and this tuning will not substantially affect the other performance characteristics of the filter.

Furthermore, parallel coupled lines and two high impedance transmission lines are utilized for the inductors. To further compact the structure, these high impedance transmission lines may be folded or curved.

The parallel coupled lines may also be arranged in a coplanar or non-coplanar configuration depending upon the application.

To achieve the above advantages, a filter is disclosed having an equivalent circuit that includes an input capacitor connected between an input terminal and ground; an output capacitor connected between an output terminal and ground; a first parallel connection of a first resonant capacitor and a first inductor; a first coupling capacitor coupling the input capacitor and the first parallel connection of the first resonant capacitor and the first inductor; a second parallel connection of a second resonant capacitor and a second inductor; a second coupling capacitor coupling said ouput capacitor and said second parallel connection of said second resonant capacitor and said second inductor; and a loss pole shifting capacitor connected to the input and output terminals, wherein the first and second inductors are magnetically coupled.

To further achieve the advantages of the invention, the first and second inductors are parallel coupled lines. Furthermore, the first and second inductors may each include a series connection of a high impedance transmission line and one of the parallel coupled lines thereby making the parallel coupled lines shorter and thereby providing a more flexible circuit layout.

To still further achieve the invention, a multilayer filter structure is disclosed that includes a lower ground plane, an upper ground plane, left and right ground planes connected to said upper and lower ground planes, an input electrode, an output electrode, a loss pole shifting capacitor layer including two loss pole shifting capacitor metal plates separated by a gap wherein the two loss pole shifting capacitor metal plates are connected to the input and output electrodes, an input/output capacitor layer including an first and second metal plates, a pair of parallel coupled lines connected to ground planes, a pair of vias connecting the pair of coupled lines to the first and second metal plates, a shielding metal layer interposed between the input/output capacitor layer and the parallel coupled lines wherein the pair of vias penetrate the shielding metal layer.

The pair of parallel coupled lines may be formed on the same or different layers and may overlap when viewed from a top or bottom perspective.

The pair of parallel coupled lines may further include a pair of high impedance lines individually connected thereto. Also, the pair of high impedance lines may have a folded configuration.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 8A is a diagram of an alternative resonant coupling inductor section in which the two coupled lines are located on different layers and are overlapped;

FIG. 8B is a diagram of an alternative resonant coupling inductor section in which the high impedance lines are folded twice and the two coupled lines are located on different layers and are overlapped;

FIG. 9A is a diagram of the loss pole shifting capacitor section;

FIG. 9B is a diagram of an alternative loss pole shifting capacitor section;

The present invention will become more fully understood from the detailed description given hereinbelow and the accompanying drawings which are given by way of illustration only, and thus are not limitative of the present invention, and wherein:

DETAILED DESCRIPTION OF PREFERRED EMBODIMENTS

Equivalent Circuits

Figure 2:
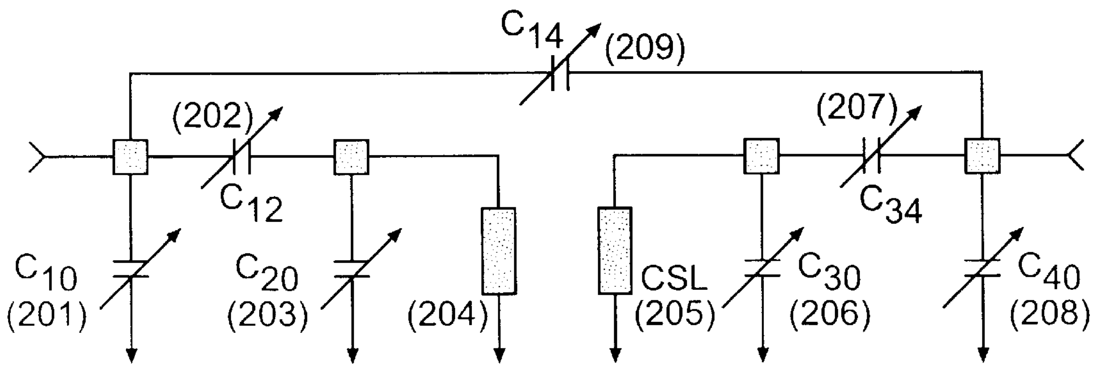
FIG. 2 is an equivalent circuit of a first embodiment of the inventive filter.
Figure 3:
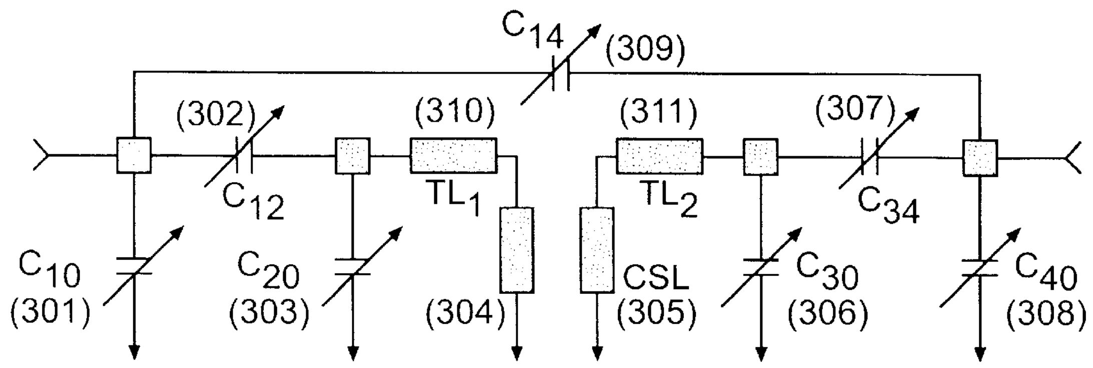
FIG. 3 is an equivalent circuit of a second embodiment of the inventive filter.

FIGS. 2 and 3 show the two alternative equivalent circuits of the inventive filter.

FIG. 2 shows the first alternative equivalent circuit of the proposed filter including input and output grounded capacitors (201, 208), coupling capacitors (202, 207), resonant capacitors (203, 206), resonant and coupling inductors (CSL:204, 205), and loss-pole shifting capacitor (209).

Figure 1A:
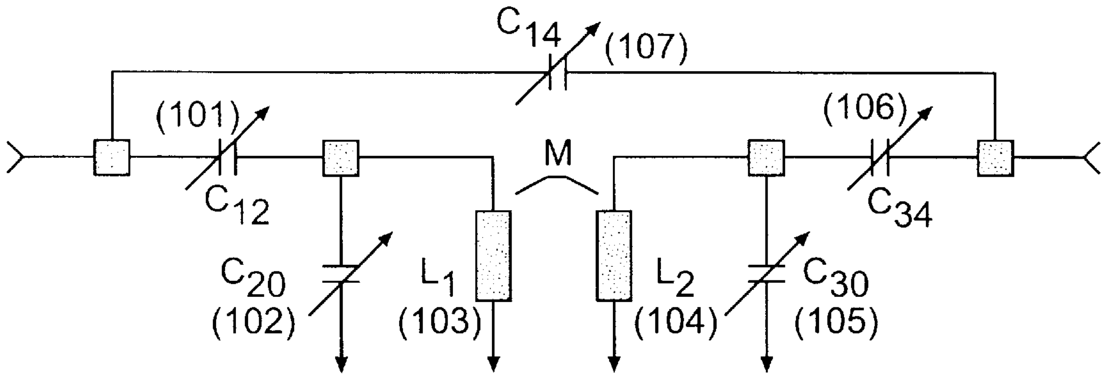
FIG. 1A (PRIOR ART)
FIGS. 1A, 1B and 1C are equivalent circuits of conventional filters.
Figure 1B:
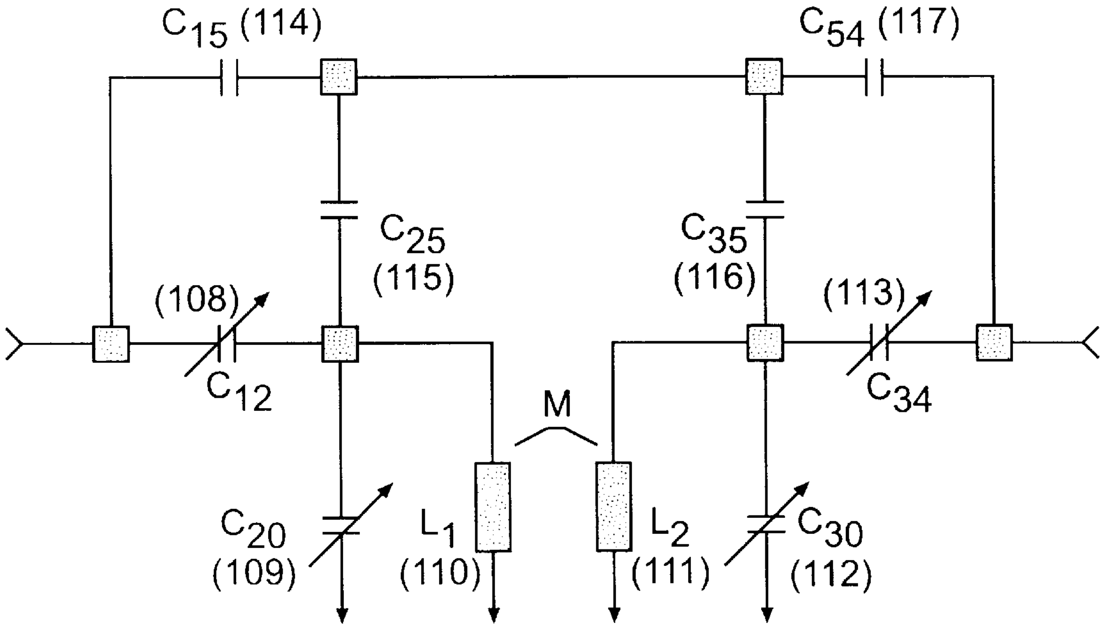
FIG. 1B (PRIOR ART)
Figure 1C:
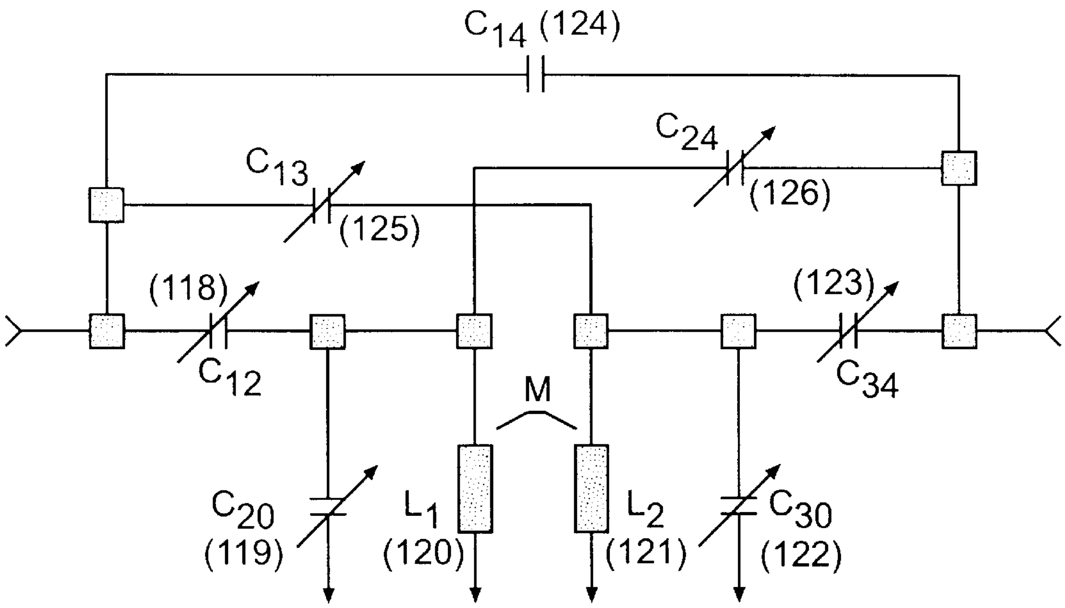
FIG. 1C (PRIOR ART)

The parallel coupled striplines (CSL:204,205) in FIG. 2 are one of methods to simulate the coupling inductor in FIG. 1. The advantages in using parallel coupled striplines (CSL: 204, 205) are the low parasitic effect and suitability for implementation with a multilayer technique to reduce the filter size.

FIG. 3 is the second alternative equivalent circuit. FIG. 3 is a modification of FIG. 2 that replaces the relatively long parallel coupled striplines (CSL: 204, 205) in FIG. 2 with two high impedance transmission lines (310, 311) and one pair of relatively short parallel-coupled striplines (CSL:304, 305).

In FIG. 3, two high impedance lines (310, 311) and one short parallel-coupled striplines are used to simulate the coupling inductor in FIG. 1. The width of each high impedance line (310, 311) is small thereby providing a flexible layout as shown in FIGS. 7 and 8 and further discussed below.

In summary, the inventive filter includes four main sections as shown in the alternatives of FIGS. 2 and 3: ① the input capacitor section (201,202,203 or 301,302,303); ② the output capacitor section (206,207,208 or 306,307,308); ③ the resonant and coupling inductor section (204,205 or 304,305,310,311); and ④ the loss-pole shifting capacitor section (209 or 309).

Implementation Of Equivalent Circuits Overview

To achieve the same filter size as FIG. 2 when implementing the equivalent circuit of FIG. 3, fewer layers of substrate than FIG. 2 may be utilized.

Furthermore, much lower values of dielectric constant may be utilized for the substrates than the substrates necessary for implementing FIG. 1. Lowering the dielectric constant is very important when the cost of tuning the filter is considered.

Figure 4:
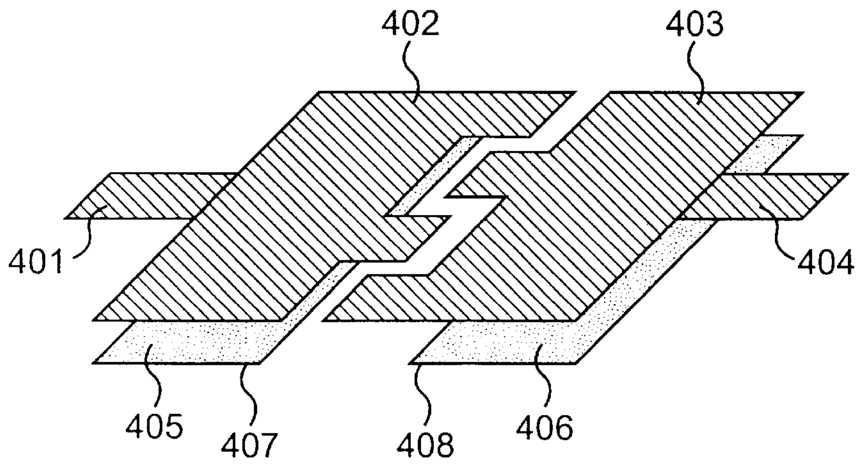
FIG. 4 is a diagram of the input and output capacitor sections of the invention.

The input and output capacitor section may be constructed as shown in FIG. 4.

Figure 5:
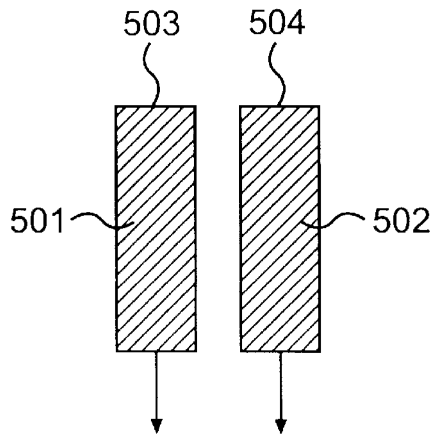
FIG. 5 is a diagram of a coplanar configuration of the resonant and coupling inductor section of the invention.

The parallel coupled striplines (CSL: 204, 205 or 304, 305) in FIGS. 2 and 3 can be implemented as shown in FIG. 5. Furthermore, this implementation can take the form of a coplanar configuration (FIG. 7) or non-coplanar configuration (FIG. 8) depending upon whether the filter is being used for narrow-band or broad-band applications, respectively.

FIGS. 9A–B illustrate alternative for the loss-pole shifting capacitor section. The spacing (905 or 915) between the two metal plates (902, 903; 912, 913) may be adjusted to obtain the desired coupling capacitance.

Figure 10:
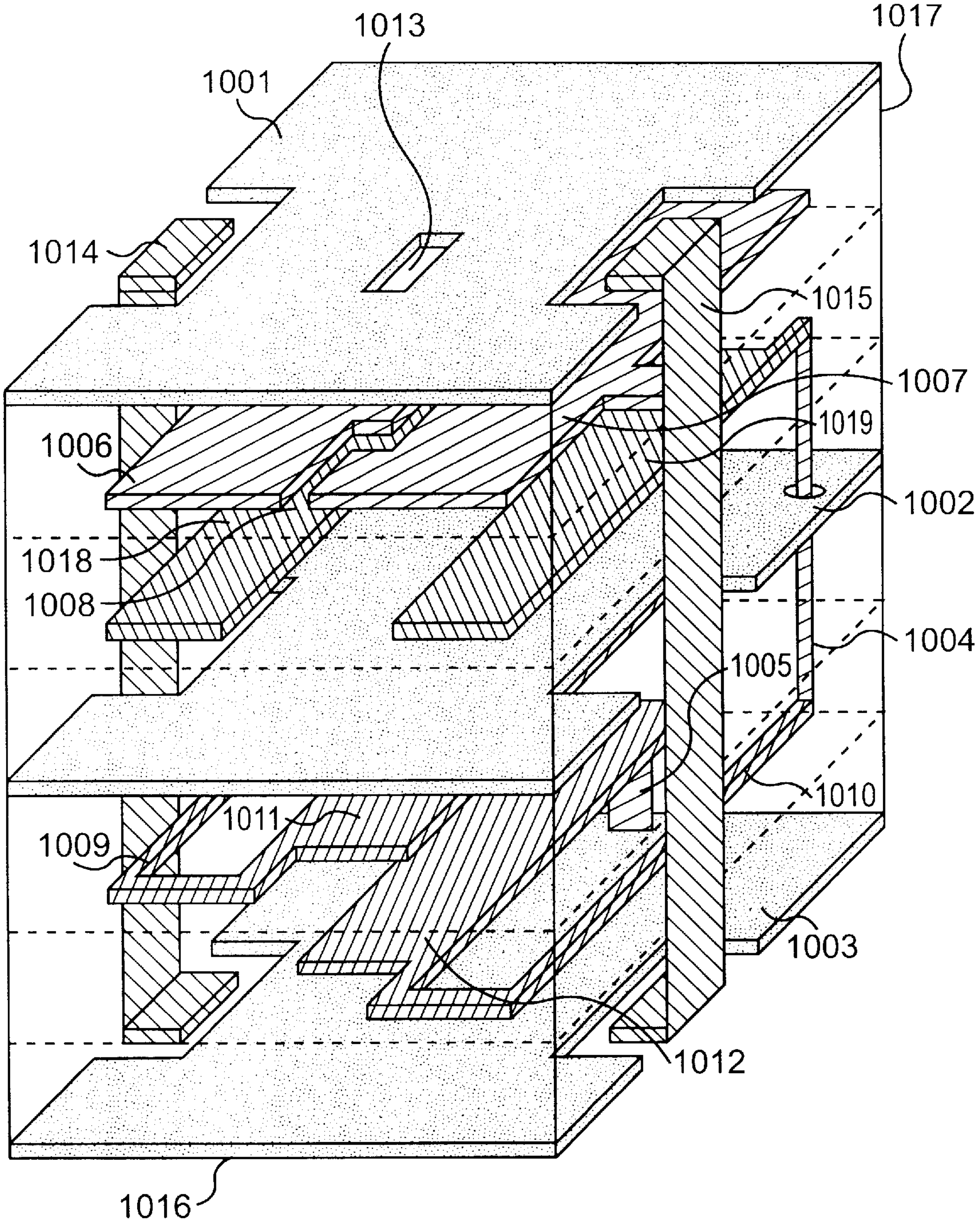
FIG. 10 is a diagram of the overall construction of a miniaturized, multilayer filter according to the invention.

FIG. 10 shows the outline of proposed filter implemented by using a multilayered technique. The equivalent circuit is shown in FIG. 3. The input/output and loss-pole shifting capacitors utilize the configuration of FIG. 4, and the resonant and coupling inductors utilize the configuration of FIG. 8A.

From FIG. 10 one can see that the filter structure is quite suitable to be built into a substrate. With little or no need of tuning, the filter can be easily integrated with other submodules to form a single, miniaturized, multifunction module.

Implementation Details

The input/output capacitor sections can be implemented by using two parallel metal plates (402,405)/(403,406) as shown in FIG. 4. In other words, the input capacitor section is formed by parallel metal plates 402 and 405 and the output capacitor section is formed by parallel metal plates 403 and 406.

Metal plates 402 and 403 separated by a gap as shown in FIG. 4 also form the loss pole shifting capacitor.

Metal plates 402 and 403 are attached to connector lines 401 and 404, respectively. Connector lines 401 and 404 preferably have an impedance of 500 and are also connected to input and output electrodes (not shown in FIG. 4 but corresponding to input side electrode 1014 and output side electrode 1015 shown in FIG. 10) of the filter.

The loss pole shifting capacitor may also take either of the forms shown in FIGS. 9A–B. In FIG. 9A, the first plate 902 is separated from the second metal plate 903 by a straight gap 905. Alternatively, as shown in FIG. 9B, the first plate 912 is separated from the second metal plate 913 by a meandering gap 915.

When fully assembled as shown in FIG. 10, the loss pole shifting capacitor plates 1006 and 1007 are attached connector lines (not labeled) similar to connector lines 401 and 404 that, in turn, are connected to the input and output side electrodes 1014 and 1015, respectively.

The resonant and coupling inductors are constructed with a pair of parallel coupled striplines 501 and 502. One end of each coupled stripline 501 and 502 is connected to ground by vias that are illustrated by arrows as shown in FIG. 5. The other end 503, 504 of these coupled lines 501, 502 are connected to metals plates 405, 406 (FIG. 4) at connection points 407 and 408, respectively.

Figure 6:
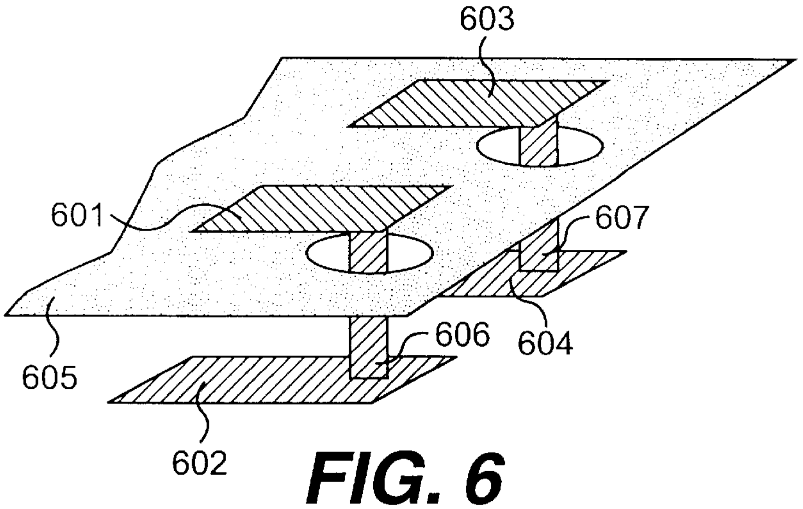
FIG. 6 is a diagram illustrating folding of the parallel coupled lines to reduce the filter size.

FIG. 6 shows a technique for further reducing the filter size. To further reduce the filter size, the parallel coupled lines (601/602; 603/604) can be folded to form two layers. In between these two layers, there is a shielding layer (605) connected to ground, as further shown in FIG. 6. The two layers of lines (601/602; 603/604) are connected by vias (606,607).

Figure 7A:
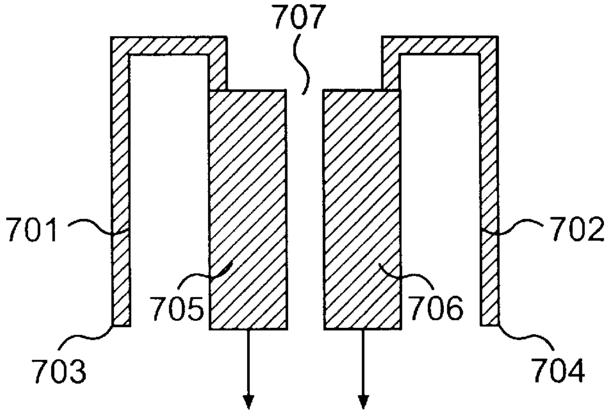
FIG. 7A is a diagram of folded high impedance lines that may be utilized with the configuration of FIG. 5.
Figure 7B:
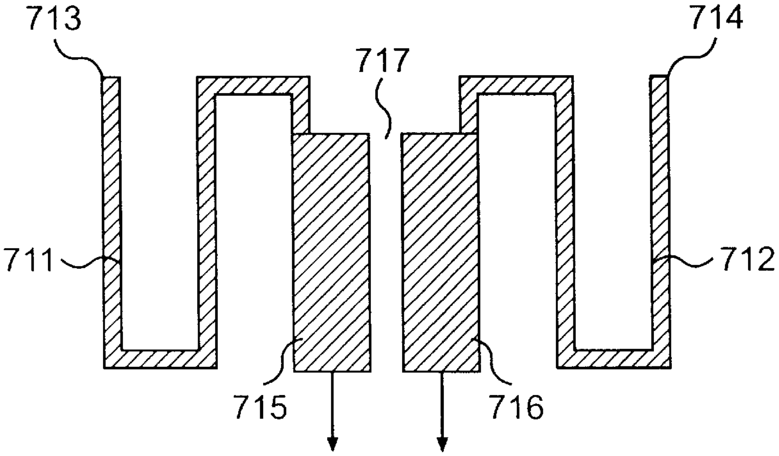
FIG. 7B is a diagram of a folded high impedance lines having two curves that may be utilized with the configurations of FIG. 5.

The resonant and coupling inductors can be implemented by using the form shown in FIGS. 7A or 7B.

First, high impedance lines (701/702; 711/712) as shown in FIGS. 7A/B are individually connected to relatively short parallel coupled lines (705/706; 715/716), respectively. Each of these high impedance lines are electrically equivalent to an inductor.

Because of the small width of the high impedance lines 701, 702, 711, 712, the circuit layout is flexible. For example, the high impedance lines can be curved once (701,702) as shown in FIG. 7A, twice (711,712) as shown in FIG. 7B, or more as desired.

The shorter parallel coupled lines (705,706; 715,716) can be implemented by using the configuration of either FIG. 5 or FIG. 6. Because their length becomes much smaller when adopting the FIG. 3 design, there is no strict need to fold the shorter parallel coupled lines (705,706; 715, 716) to another layer. The ends 703 (or 713) 704 (or 714) of high impedance lines 701 (or 711), 702 (or 712) are connected Lo metal plates 405, 406 (FIG. 4) at connection points 407 and 408, respectively.

For broadband applications, either of the configurations shown in FIGS. 8A–B can be adopted to achieve a higher coupling factor. In these cases, the parallel coupled lines are preferably located at different layers and are overlapped (807;817).

To have the same grounded effect, the upper line (805;815) is connected to an upper ground plane while the lower line (806;816) is connected to a lower ground plane by using vias (809;819) and (810;820), respectively as further shown in FIGS. 8A–B.

Because the parallel coupled lines are at different layers the length of high impedance lines 801 and 802 (or 811 and 812) are different to account for the effect of the vias (808 or 818), respectively. The ends 803 (or 813), 804 (or 814) of high impedance lines 801 (or 811), 802 (or 812) are connected to metal plates 405, 406 (FIG. 4) at connection points 407 and 408, respectively.

FIGS. 9A–B show two ways to obtain the desired capacitance of loss-pole shifting capacitor. The metal plate 902 or 912 corresponds to metal plate 402 of FIG. 4. In the same fashion, metal plate 903 or 913 corresponds to metal pate 403; metal plate 901 or 911 corresponds to metal plate 401; and metal plate 904 or 914 corresponds to metal plate 404.

By adjusting the spacing (905;915) between the two metal plates (902, 903; 912, 913) the desired coupling capacitance and thus the desired location of loss poles can be achieved.

FIG. 10 shows the outline of proposed filter implemented with a multilayer technique.

As mentioned above the filter shown in FIG. 10 has an equivalent circuit that is shown in FIG. 3. The input/output and loss-pole shifting capacitors utilize the configuration of FIG. 4, and the resonant and coupling inductors utilize the configuration of FIG. 8A.

In the preferred structure, there are six substrate layers each with thickness of approximately 8.5 mils and relative dielectric constant of 7.8 and seven layers of metal.

The 1st (1001) and 7th (1003) metal layers are grounded and form upper and lower ground planes, respectively. The 4th (1002) metal layer functions as a shielding layer and is connected to ground by side metal plates (1016, 1017).

The second metal layer forms the loss-pole shifting capacitor that includes two coplanar metal plates 1006 and 1007. The spacing 1008 between metal plates 1006 and 1007 can be controlled to achieve the desired coupling capacitance.

The loss pole shifting capacitor plates 1006 and 1007 are attached to connector lines (not labeled) similar to connector lines 401 and 404 that, in turn, are connected to the input and output side electrodes 1014 and 1015, respectively.

The third metal layer in conjunction with the second metal layer forms the input/output capacitor sections and includes metal plates 1018 and 1019.

A shielding layer of metal is provided as the fourth metal layer and is connected to ground by the side metals 1016 and 1017.

The parallel coupled lines comprise the fifth and sixth metal layers and include metal plate 1012 that is formed on a different layer, but overlapping with metal plate 1011 when viewed from a top or bottom perspective. The high impedance lines 1009 and 1010 are curved once and are connected to the parallel coupled lines (1011,1012).

The high impedance line configuration of FIG. 8A is also utilized to shorten the length of the parallel coupled lines 1012 and 1011. More particularly, metal 1012 is connected to high impedance line 1010 and metal 1011 is connected to high impedance line 1009. High impedance lines 1009, 1010 have a folded configuration to further reduce the filter size.

The interconnect between different layers is implemented with vias. More particularly, the metals 1019/1018 of the output/input capacitor sections are respectively connected to high impedance lines 1010, 1009 of the inductor section by via 1004 (shown) and its counterpart (not shown).

Furthermore, one end of the parallel coupled line 1012 is connected to the lower ground plane 1003 by via 1005 and one end of the parallel coupled line 1011 is connected to the shielding ground plane 1002 by another via (not shown).

A substrate (not explicitly shown in FIG. 10) fills all of the spaces between the metal layers.

In certain applications, a conventional laser trimming system may be utilized to cut part 1013 of the top surface metal 1001. This trimming operation changes only the location of loss poles and does not necessitate redesigning the whole circuit.

One can vary the amount of overlapping, thickness or dielectric constant of the substrate to obtain the desired coupling capacitance. By using side electrodes 1014 and 1015 the filter can be connected to the peripheral circuits.

In practical application the thickness, dielectric constant, and the number of substrate layers can be chosen as desired.

A filter according to the invention was constructed as a working example operating at 1.9 GHz and having a size of 4.5 mm×3.2 mm×1.3 mm. This example shows that the proposed invention can achieve the miniaturized design using a substrate with much lower dielectric constant ($\epsilon_r$= 7.8).

Figure 11:
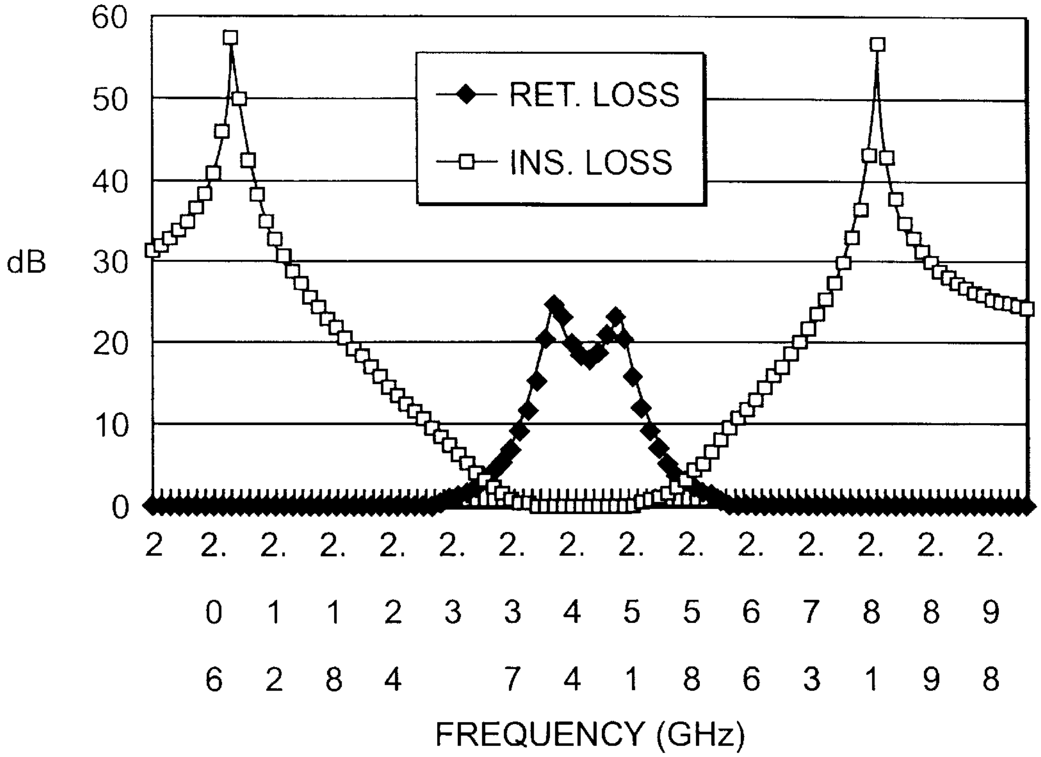
FIG. 11 shows the simulated result of the filter shown in FIG. 10.

FIG. 11 shows the simulated filter response corresponding to the equivalent circuit of FIG. 3 that may be implemented as shown in FIG. 10.

Figure 12:
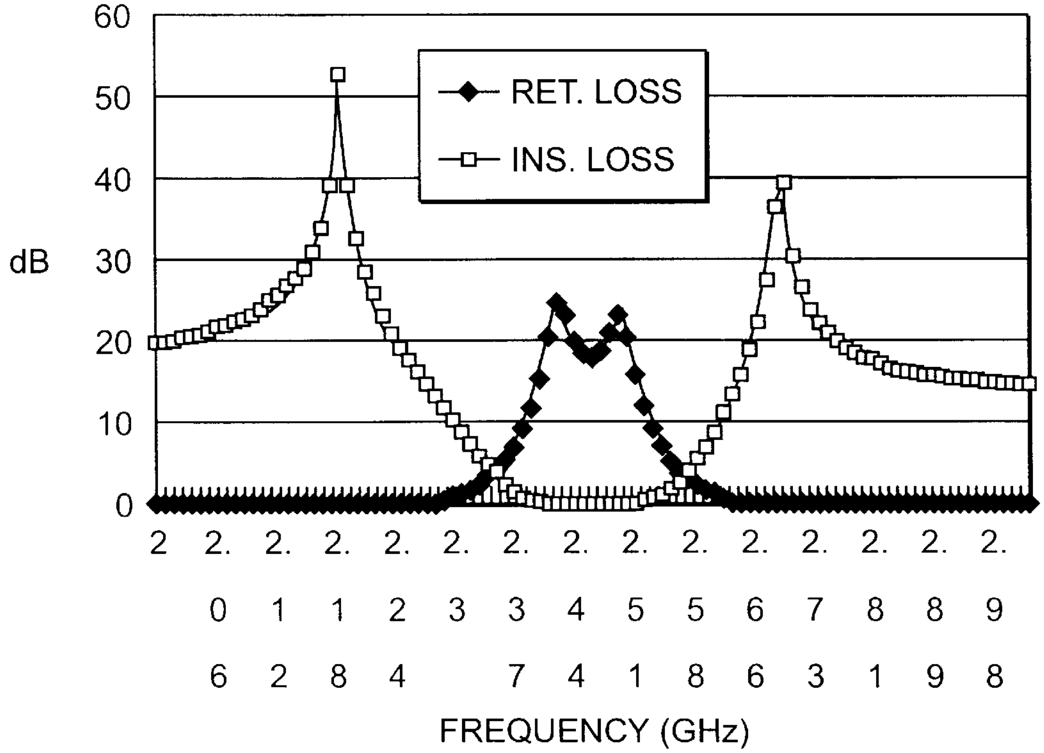
FIG. 12 shows the simulated result of the filter shown in FIG. 10 where the capacitance of the loss-pole shifting capacitor is increased relative to the result of FIG. 11.

FIG. 12 shows the simulated result by increasing the capacitance of the loss-pole shifting capacitor. The two loss poles move toward the passband as compared with FIG. 11.

Figure 13:
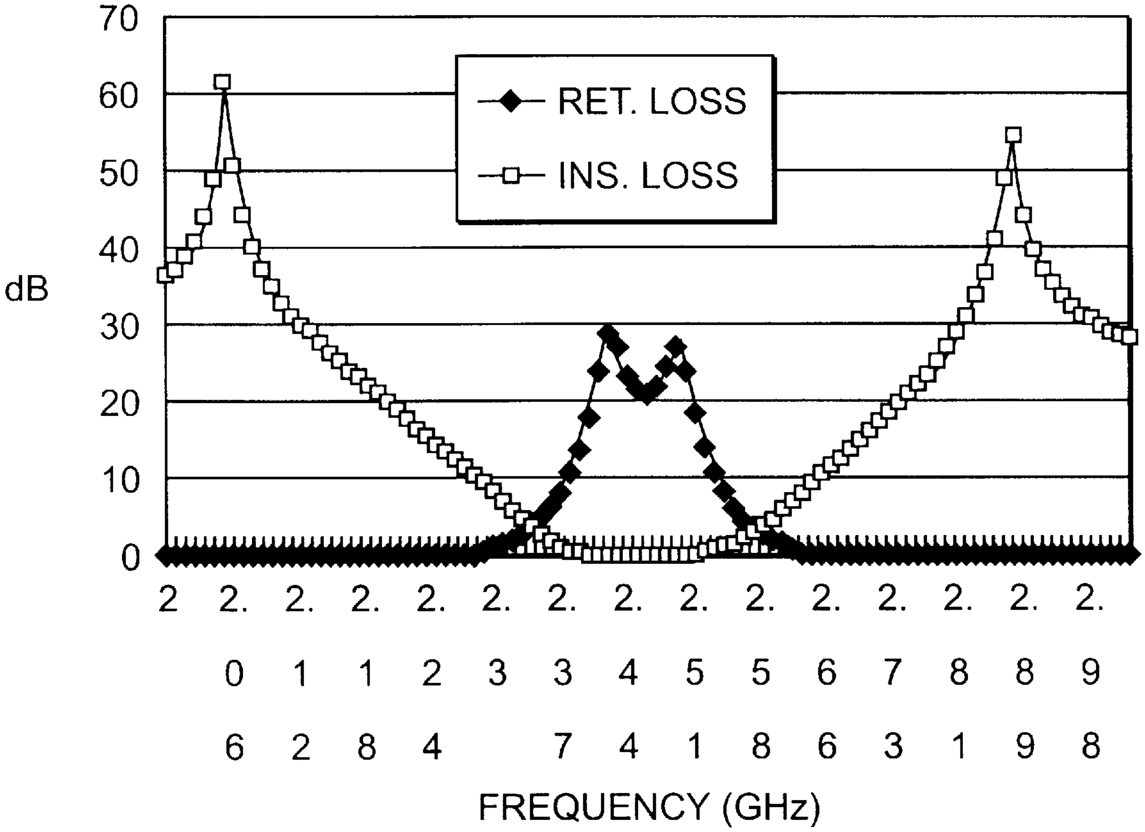
FIG. 13 shows the simulated result of the filter shown in FIG. 10 where the capacitance of the loss-pole shifting capacitor is decreased relative to the result of FIG. 11.

FIG. 13 shows the simulated result by decreasing the capacitance of loss-pole shifting capacitor. The two loss poles move outward from the passband as compared with FIG. 11.

Returning to the simulated filter response shown in FIG. 11: there are two loss poles near the passband that are unsymmetrical with respect to the central frequency. It is possible to design the filter with arithmetic-symmetrical frequency response in using FIG. 2 or FIG. 3. The different is that the components of equivalent circuit become unsymmetrical in values.

One of the advantages of proposed filter is that it shows little effect in bandwidth, central frequency, and insertion loss when adjusting the capacitance of the loss-pole shifting capacitor.

In designing the filter, the components values of FIG. 2 or FIG. 3 are determined from the central frequency, bandwidth, and locations of loss poles of the required system specifications. A rigorous electromagnetic simulator is then used to translate circuit parameters to layout parameters of the multilayer structure as is known in the art.

In summary, the inventive filter has a structure which is suitable for burying into the substrate and is easy to integrate with other sub-modules to form a single, miniaturized, multifunction module.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A filter, comprising;

an input capacitor connected between an input terminal and ground, an output capacitor connected between an output terminal and ground, a first parallel connection of a first resonant capacitor and a first inductor, a first coupling capacitor coupling said input capacitor and said first parallel connection of said first resonant capacitor and said first inductor, a second parallel connection of a second resonant capacitor and a second inductor, a second coupling capacitor coupling said output capacitor and said second parallel connection of said second resonant capacitor and said second inductor, and a loss pole shifting capacitor connected to the input and output terminals, wherein the first and second inductors are magnetically coupled, said first and second inductors are parallel coupled lines, said first and second inductors each including a series connection of a high impedance transmission line and one of said parallel coupled lines.

2. A multilayer filter structure, comprising:

a lower ground plane, a shielding ground plane, an upper ground plane, left and right ground planes connected to said upper, lower and shielding ground planes, an input electrode, an output electrode, a loss pole shifting capacitor layer including two loss pole shifting capacitor metal plates separated by a gap wherein the two loss pole shifting capacitor metal plates are connected to said input and output electrodes, an input/output capacitor layer including a first and second metal plates, a pair of parallel coupled lines connected to said shielding and lower ground planes, and a pair of vias connecting said pair of coupled lines to said first and second metal plates, said shielding ground plane interposed between said input/output capacitor layer and said parallel coupled lines wherein said pair of vias penetrate said shielding ground plane, said pair of parallel coupled lines including a pair of high impedance lines individually connected thereto.

3. The multilayer filter structure according to claim 2, wherein the gap separating said two loss pole shifting capacitor metal plates is a substantially straight gap.

4. The multilayer filter structure according to claim 2, wherein the gap separating said two loss pole shifting capacitor metal plates is a meandering gap.

5. The multilayer filter structure according to claim 2, said pair of parallel coupled lines being formed on the same layer.

6. The multilayer filter structure according to claim 2, said pair of parallel coupled lines being formed on different layers.

7. The multilayer filter structure according to claim 6, said pair of parallel coupled lines overlap when viewed from a top or bottom perspective.

8. The multilayer filter structure according to claim 2, said two loss pole shifting capacitor metal plates being connected to said input and output electrodes via 50 Ω transmission lines.

9. The multilayer filter structure according to claim 2, said pair of high impedance lines having a folded configuration.

10. The multilayer filter structure according to claim 9, wherein the folded configuration includes a plurality of folds.

* * * * *